(12) United States Patent
Chen et al.

(10) Patent No.: US 11,574,684 B2
(45) Date of Patent: Feb. 7, 2023

(54) DYNAMIC RANDOM ACCESS MEMORY AND PROGRAMMING METHOD THEREFOR

(71) Applicant: NS POLES TECHNOLOGY CORP., Zhuhai (CN)

(72) Inventors: Chao Yang Chen, Zhubei (TW); Ming Sheng Tung, Hsinchu (TW)

(73) Assignee: NS Poles Technology Corp., Zhuhai (CN)

(*) Notice: Subject to any disclaimer, the term of this patent is extended or adjusted under 35 U.S.C. 154(b) by 0 days.

(21) Appl. No.: 17/240,008

(22) Filed: Apr. 26, 2021

(65) Prior Publication Data

US 2022/0215884 A1 Jul. 7, 2022

(30) Foreign Application Priority Data

Jan. 5, 2021 (TW) .................................. 110100195

(51) Int. Cl.
| | |
|---|---|
| *G11C 16/10* | (2006.01) |
| *G11C 16/24* | (2006.01) |
| *G11C 16/26* | (2006.01) |
| *G11C 16/30* | (2006.01) |
| *G11C 5/06* | (2006.01) |

(52) U.S. Cl.
CPC .............. *G11C 16/102* (2013.01); *G11C 5/06* (2013.01); *G11C 16/24* (2013.01); *G11C 16/26* (2013.01); *G11C 16/30* (2013.01)

(58) Field of Classification Search
None
See application file for complete search history.

(56) References Cited

U.S. PATENT DOCUMENTS

| | | | | |
|---|---|---|---|---|
| 2015/0062998 | A1* | 3/2015 | Nam | ..................... H01L 23/5252 365/96 |
| 2020/0051987 | A1* | 2/2020 | Wang | ................. H01L 21/76224 |
| 2022/0246199 | A1* | 8/2022 | Lu | ......................... G11C 11/4096 |

FOREIGN PATENT DOCUMENTS

TW 727850 B1 * 5/2021 ......... G11C 11/1655

* cited by examiner

*Primary Examiner* — Ly D Pham
(74) *Attorney, Agent, or Firm* — Rosenberg, Klein & Lee

(57) ABSTRACT

The present invention relates to a dynamic random access memory and a programming method therefor with two stages. In a first stage, a capacitor of a memory cell of the dynamic random access memory is broken down, so that the dynamic random access memory becomes a one-time programmable memory. In a second stage, a resistance of the capacitor that is broken down is reduced, so that state data of the memory cell can be more easily interpreted.

13 Claims, 2 Drawing Sheets

DYNAMIC RANDOM ACCESS MEMORY AND PROGRAMMING METHOD THEREFOR

This application claims priority of Application No. 110100195 filed in Taiwan on 5 Jan. 2021 under 35 U.S.C. § 119; the entire contents of all of which are hereby incorporated by reference.

BACKGROUND OF THE INVENTION

Field of the Invention

The present invention relates to a dynamic random access memory (DRAM), in particular, to a dynamic random access memory as one time programmable (OTP) memory and a programming method therefor.

Description of the Prior Art

In modem IC industry, OTP memory is an important non-volatile memory. The OTP memory is often used to store code or firmware that will not change. In the memory industry, OTP memory can also be used to record the address of a failure column, the address of a failure row, or the address of a failure bit, so that redundant columns, redundant rows, or redundant bits can replace failure columns, failure rows or failure bits.

Traditional OTP memory uses high voltage to blow its internal electronic fuse. Since electronic fuses require a larger area, the traditional OTP memory will take up a large chip area and require additional manufacturing process to make electronic fuses, which will increase the cost of the die.

SUMMARY OF THE INVENTION

One of the objectives of the present invention is to provide a dynamic random access memory as OTP memory and a programming method therefor.

One of the objectives of the present invention is to provide a two-stage programming method for a dynamic random access memory.

The present invention provides the following solutions:

A dynamic random access memory includes a word line, a bit line, and a memory cell. The memory cell includes a capacitor and a transistor. The capacitor has a first terminal and a second terminal. The transistor is connected between the bit line and the first terminal of the capacitor, and a gate electrode of the transistor is electrically connected to the word line. The programming method of the present invention includes: in a first stage, turning on the transistor to connect the first terminal of the capacitor to the bit line, and applying a first voltage and a second voltage to the bit line and the second terminal of the capacitor respectively to break down the capacitor; in a second stage, turning off the transistor, and applying a ground reference voltage and a third voltage to the second terminal and a substrate of the transistor respectively to generate a first current flowing through the capacitor.

According to the specific embodiment of the present invention, the present invention discloses the following technical effects: the present invention uses a dynamic random access memory as the one time programmable memory, which does not need to use electronic fuses, so that the present invention may provide a small-area one time programmable memory.

DESCRIPTION OF THE PREFERRED EMBODIMENTS

In order to more clearly describe the technical solutions in the embodiments of the present invention or in the prior art, the drawings to be used in the description of the embodiments will be briefly introduced hereafter. It would be obvious that the drawings described below are only some embodiments of the present invention, and a person skilled in the art could obtain other drawings according to these accompanying drawings without involving an inventive effort.

Clear and intact description will be made on technical schemes in the embodiments of the present invention below in combination with drawings in the embodiments of the present invention. Obviously, the described embodiments are merely a part of embodiments of the present invention and are not all the embodiments. Based on the embodiments of the present invention, all the other embodiments obtained by those of ordinary skill in the art without inventive effort are within the scope of the present invention.

An objective of the present invention provides a dynamic random access memory and a programming method therefor; by using the dynamic random access memory as the one time programmable memory, electronic fuses are not required, so that the present invention may provide a small-area one time programmable memory.

To enable the above objects, features and advantages of the present invention to be more apparent and easily understood, the present application will be further elaborated hereafter in connection with the drawings and specific embodiments.

Figure 1:
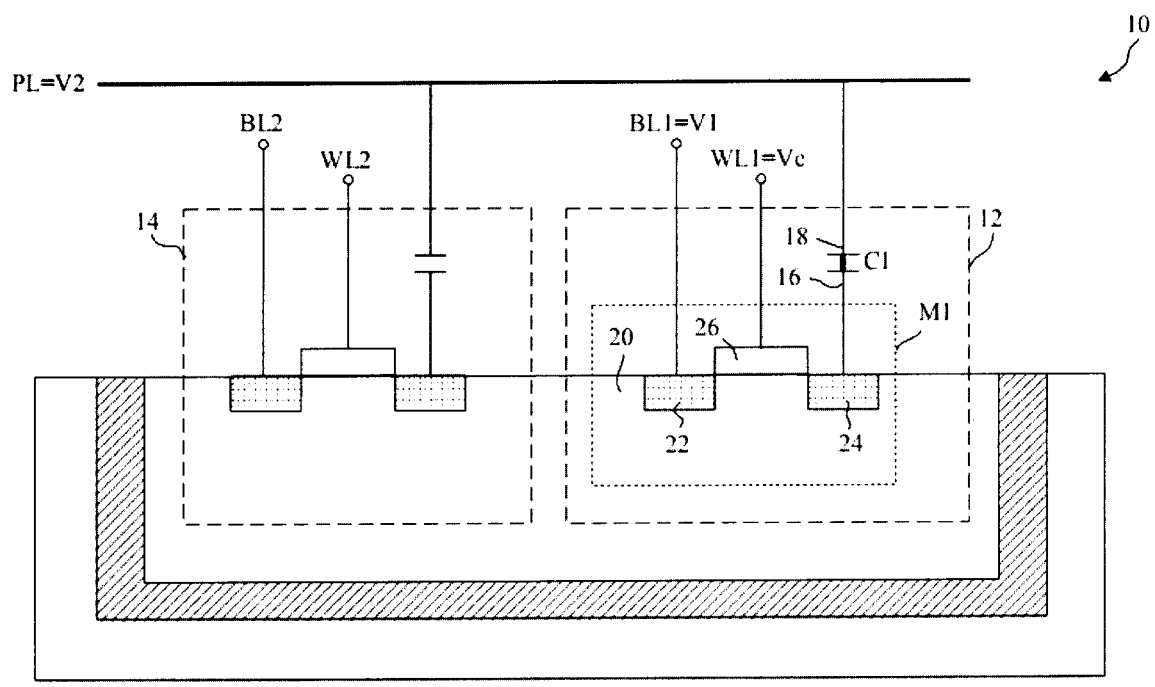
FIG. 1 is an embodiment of a first stage of a programming method for a dynamic random access memory in the present invention.
Figure 2:
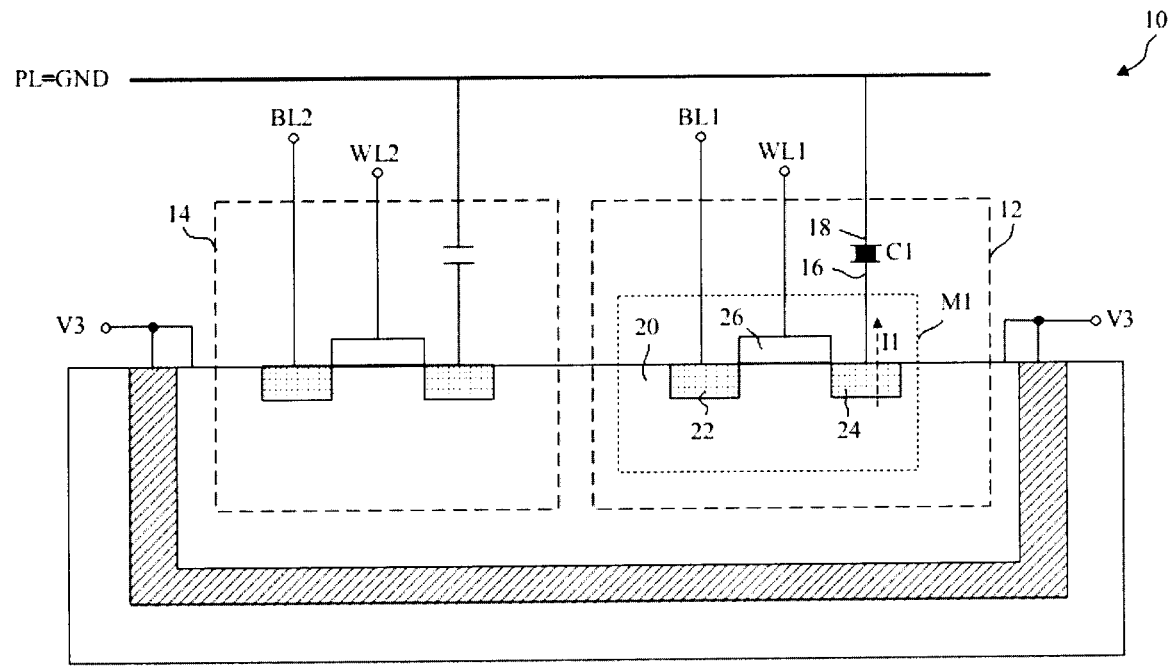
FIG. 2 is an embodiment of a second stage of a programming method for a dynamic random access memory in the present invention.
Figure 3:
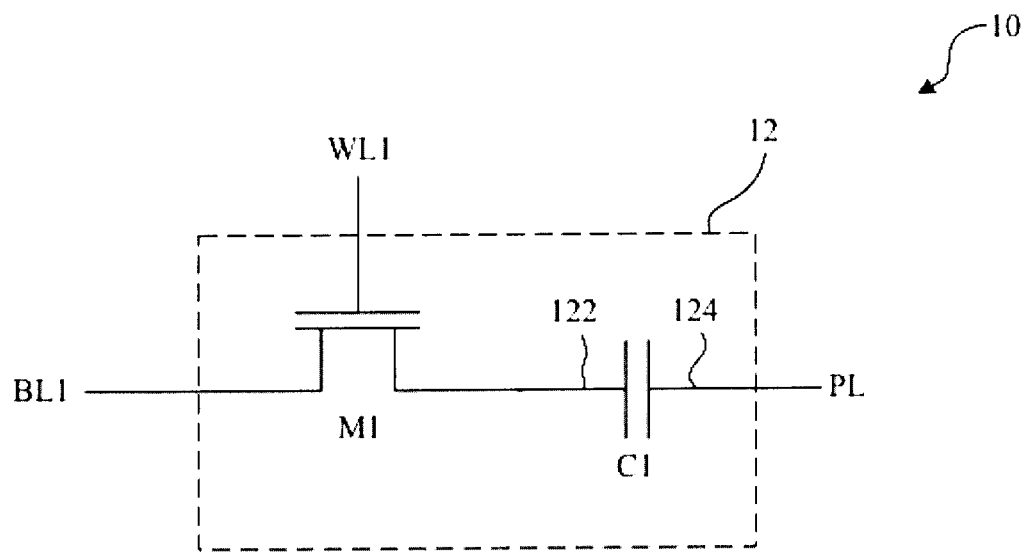
FIG. 3 is a circuit diagram of a memory cell.

FIGS. 1 and 2 show a programming method for a dynamic random access memory (DRAM) 10 in the present invention. The DRAM 10 includes a plurality of memory cells 12, 14, a plurality of word lines WL1, WL2, and a plurality of bit lines BL1, BL2. The DRAM selects the memory cells 12 and 14 to be read and programmed through the plurality of word lines WL1, WL2, and the plurality of bit lines BL1, BL2. FIG. 3 is a circuit diagram of a memory cell 12. As shown in FIGS. 1 and 3, the memory cell 12 includes a transistor M1 and a capacitor C1, wherein the transistor M1 is connected between the bit line BL and a first terminal 16 of the capacitor C1, a voltage on the word line WL1 control the transistor M1 to turn on or off, and a second terminal 18 of the capacitor C1 is connected to a plateline PL. The plurality of memory cells 12 and 14 of the DRAM share one plateline PL. The memory cell 12 in FIG. 1 has a 1T1C architecture, but the invention is not limited to this. For example, the memory cell 12 may be a 2T1C architecture. The circuit of the memory cell 14 is the same as the circuit of the memory cell 12, and isn't redundantly described herein.

As shown in FIGS. 1 and 2, the transistor M1 includes a substrate 20, a first doped region 22, a second doped region 24, and a gate electrode 26. The first doped region 22 and the second doped region 24 are in the substrate 20, and are respectively connected to the bit line BL1 and the first terminal 16 of the capacitor C1. The gate electrode 26 is between the first doped region 22 and the second doped region 24 and on the substrate 20. The substrate 20 has a first conductivity type, and the first doped region 22 and the second doped region 24 have a second conductivity type. In the present embodiment, the transistor M1 is an NPN transistor, so that the first conductivity type is P type, and the second conductivity type is N type.

The programming method for a DRAM 10 in the present invention is divided into two stages, which are described by taking the programmed memory unit 12 as an example. As shown in FIGS. 1 and 3, in a first stage of the programming operation, the word line WL1 is applied with a voltage Vc to turn on the transistor M1, while the bit line BL1 and the plateline PL are also applied with a first voltage V1 and a second voltage V2, respectively. In other words, the first voltage V1 and the second voltage V2 are respectively applied to the first terminal 16 and the second terminal 18 of the capacitor C1. A voltage difference between the first voltage V1 and the second voltage V2 may cause the capacitor C1 to be broken down. The voltage difference between the first voltage V1 and the second voltage V2 may be about 3V~6V. The first voltage V1 is greater than a ground reference voltage GND of the DRAM 10, and the second voltage V2 is less than the ground reference voltage GND, wherein the ground reference voltage GND is a voltage of a ground terminal of the DRAM 10. In an embodiment, the ground reference voltage is 0V, the first voltage V1 is 2.5V, and the second voltage V2 is −1.5V. Since the capacitor C1 may not be recovered after being broken down, the DRAM 10 may be used as the OTP memory. The capacitor C1 may be regarded as a high resistance element before being broken down, and the capacitor C1 may be regarded as a low resistance element after being broken down. Therefore, a data state of the memory cell 12 may be judged by monitoring a resistance of the capacitor C1. For example, when a resistance value of the capacitor C1 is greater than a preset value, it is determined that the data state of the memory cell 12 is "0"; when the resistance value of the capacitor C1 is less than the preset value, it is determined that the data state of the memory cell 12 is "1".

After the capacitor C1 is broken down, the smaller the resistance of the capacitor C1 is, the faster the data state of the memory cell 12 may be determined during the read operation. Therefore, the programming method of the present invention may perform a second stage to reduce the resistance value of the capacitor C1 after the capacitor C1 is broken down in the first stage. As shown in FIG. 2, after the first stage of the programming operation is over and the second stage of the programming operation is entered, applying voltage to the word line WL1 is stopped to turn off the transistor M1 and make the bit line BL1 in a floating state. Then, the ground reference voltage GND is applied to the plateline PL, and a third voltage V3 is applied to the substrate 20 of the transistor M1, wherein the third voltage V3 is greater than the ground reference voltage GND. The third voltage V3 may be 1V~3.5V. In the present invention, the third voltage V3 is 3V. After the ground reference voltage GND and the third voltage V3 are respectively applied to the second terminal 18 (plateline PL) of the capacitor C1 and the substrate 20 of the transistor M1, a first current I1 is generated to flow through the substrate 20, the second doped region 24 and the capacitor C1 to the plateline PL, and the resistance value of the capacitor C1 may be further reduced when the first current I1 flows through the capacitor C1.

Figure 4:
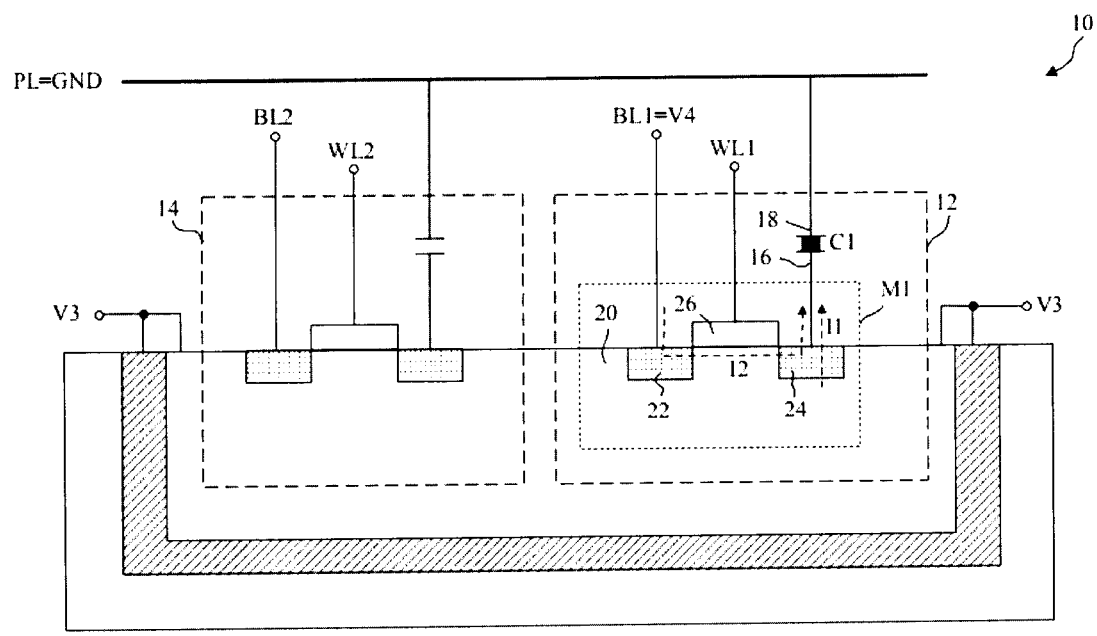
FIG. 4 is another embodiment of a second stage of a programming method for a dynamic random access memory in the present invention.

FIG. 4 is another embodiment of a second stage of a programming method in the present invention. As shown in FIG. 4, after the first stage of the programming operation is over and the second stage of the programming operation is entered, applying voltage to the word line WL1 is stopped to turn off the transistor M1. Then, the ground reference voltage GND is applied to the plateline PL, a third voltage V3 is applied to the substrate 20 of the transistor M1 and a fourth voltage V4 is applied to the bit line BL1, wherein the third voltage V3 and the fourth voltage V4 are greater than the ground reference voltage GND. The third voltage V3 and the fourth voltage V4 may be 1V~3.5V. In the present invention, the third voltage V3 is 3V, and the fourth voltage V4 is 3.5V. After the ground reference voltage GND, the third voltage V3 and the fourth voltage V4 are respectively applied to the second terminal 18 (plateline PL) of the capacitor C1, the substrate 20 of the transistor M1 and the bit line BL1, a first current I1 is generated to flow through the substrate 20, the second doped region 24 and the capacitor C1 to the plateline PL, and a second current I2 is generated to flow through the first doped region 22, the substrate 20, the second doped region 24 and the capacitor C1 to the plateline PL. The resistance value of the capacitor C1 may be further reduced when the first current I1 and the second current I2 flow through the capacitor C1. Compared with the embodiment of FIG. 2, the embodiment of FIG. 3 allows a larger current (I1+I2) to flow through the capacitor C1, thus speeding up the programming.

What is described above is only the embodiments of the present invention but does not limit the present invention in any form. The preferred embodiments are used to disclose the present invention as above but not to limit the present invention. Those skilled in the art may utilize the disclosed technical contents to make some alterations and modifications as equivalent embodiments of equal changes without departing form the scope of the technical scheme of the present invention and any simple alterations, equivalent changes and modifications made according to the technical essence of the present invention without departing from the technical contents of the present invention should be contained in the scope of the technical scheme of the present invention.

What is claimed is:

1. A dynamic random access memory, comprising:
    a word line;
    a bit line;
    a capacitor, having a first terminal and a second terminal; and
    a transistor, connected between the bit line and the first terminal of the capacitor;
    wherein in a first stage of a programming operation, the transistor is turned on, and a first voltage and a second voltage are respectively applied to the bit line and the second terminal to break down the capacitor;
    wherein in a second stage of the programming operation, the transistor is turned off, and a ground reference voltage and a third voltage are respectively applied to the second terminal and a substrate of the transistor to generate a first current flowing through the capacitor;
    wherein the capacitor and the transistor form a memory cell.

2. The dynamic random access memory according to claim 1, wherein the substrate has a first conductivity type, and the transistor further comprises:
- a first doped region in the substrate, having a second conductivity type, wherein the first doped region is electrically connected to the bit line;
- a second doped region in the substrate, having the second conductivity type, wherein the second doped region is electrically connected to the first terminal; and
- a gate electrode on the substrate and between the first doped region and the second doped region, wherein the gate electrode is electrically connected to the word line.

3. The dynamic random access memory according to claim 1, wherein the first voltage and the third voltage are greater than the ground reference voltage, and the second voltage is less than the ground reference voltage.

4. The dynamic random access memory according to claim 1, wherein the ground reference voltage is 0V, the first voltage is 2.5V, the second voltage is −1.5V, and the third voltage is 1V~3.5V.

5. The dynamic random access memory according to claim 1, further comprising a fourth voltage applied to the bit line to generate a second current flowing through the capacitor in the second stage, the fourth voltage being greater than the ground reference voltage.

6. The dynamic random access memory according to claim 5, wherein the fourth voltage is 1V~3.5V.

7. The dynamic random access memory according to claim 1, wherein in the first stage, a voltage difference between the first terminal and the second terminal is 3V~6V.

8. A programming method for a dynamic random access memory, the dynamic random access memory comprising a memory cell and a bit line, the memory cell having a capacitor and a transistor, the transistor being connected between a first terminal of the capacitor and the bit line, the programming method comprising:

in a first stage, performing steps of:
- turning on the transistor to connect the first terminal of the capacitor to the bit line of the dynamic random access memory; and
- applying a first voltage and a second voltage to the bit line and the second terminal of the capacitor respectively to break down the capacitor; and in a second stage, performing steps of:
- turning off the transistor; and
- applying a ground reference voltage and a third voltage to the second terminal and a substrate of the transistor respectively to generate a first current flowing through the capacitor.

9. The programming method for a dynamic random access memory according to claim 8, wherein the first voltage and the third voltage are greater than the ground reference voltage, and the second voltage is less than the ground reference voltage.

10. The programming method for a dynamic random access memory according to claim 8, wherein the ground reference voltage is 0V, the first voltage is 2.5V, the second voltage is −1.5V, and the third voltage is 1V~3.5V.

11. The programming method for a dynamic random access memory according to claim 8, further comprising applying a fourth voltage to the bit line to generate a second current flowing through the capacitor in the second stage, the fourth voltage being greater than the ground reference voltage.

12. The programming method for a dynamic random access memory according to claim 11, wherein the fourth voltage is 1V~3.5V.

13. The programming method according to claim 8, wherein in the first stage, a voltage difference between the first terminal and the second terminal is 3V~6V.

* * * * *